(12) United States Patent
Sparks et al.

(10) Patent No.: US 9,299,910 B1
(45) Date of Patent: Mar. 29, 2016

(54) RESONATOR ANCHORS AND RELATED APPARATUS AND METHODS

(71) Applicant: Analog Devices, Inc., Norwood, MA (US)

(72) Inventors: Andrew Sparks, Cambridge, MA (US); Florian Thalmayr, Unterhaching (DE); Jan H. Kuypers, Rehau (DE)

(73) Assignee: Analog Devices, Inc., Norwood, MA (US)

( * ) Notice: Subject to any disclaimer, the term of this patent is extended or adjusted under 35 U.S.C. 154(b) by 399 days.

(21) Appl. No.: 13/896,183

(22) Filed: May 16, 2013

Related U.S. Application Data

(60) Provisional application No. 61/648,238, filed on May 17, 2012.

(51) Int. Cl.
*H01L 41/053* (2006.01)

(52) U.S. Cl.
CPC .................................. *H01L 41/053* (2013.01)

(58) Field of Classification Search
USPC ......... 310/348, 321, 352, 344, 309, 353, 334, 310/368, 367, 369
See application file for complete search history.

(56) References Cited

U.S. PATENT DOCUMENTS

| | | | |
|---|---|---|---|
| 2,410,825 A | 11/1946 | Lane | |
| 4,139,793 A | 2/1979 | Michel | |
| 4,443,728 A | 4/1984 | Kudo | |
| 4,609,844 A * | 9/1986 | Nakamura et al. | 310/321 |
| 4,900,971 A | 2/1990 | Kawashima | |
| 5,001,383 A * | 3/1991 | Kawashima | 310/367 |
| 5,025,346 A | 6/1991 | Tang et al. | |
| 5,640,133 A | 6/1997 | MacDonald et al. | |
| 5,914,553 A | 6/1999 | Adams et al. | |
| 6,124,765 A | 9/2000 | Chan et al. | |
| 6,739,190 B2 | 5/2004 | Hsu et al. | |
| 6,828,713 B2 | 12/2004 | Bradley et al. | |
| 6,909,221 B2 | 6/2005 | Ayazi et al. | |
| 6,930,569 B2 | 8/2005 | Hsu | |
| 6,943,484 B2 | 9/2005 | Clark et al. | |

(Continued)

FOREIGN PATENT DOCUMENTS

| | | |
|---|---|---|
| WO | WO 98/01948 A1 | 1/1998 |
| WO | WO 02/17481 A2 | 2/2002 |

(Continued)

OTHER PUBLICATIONS

Humad et al., "High frequency micromechanical piezo-on-silicon block resonators," Int'l Electron Devices Meeting 2003 IEDM. Technical Digest, Washington, D.C. Dec. 8-10, 2003, New York, NY: IEEE US Dec. 8, 2003, pp. 957-960.

(Continued)

*Primary Examiner* — Thomas Dougherty
*Assistant Examiner* — Karen B Addison
(74) *Attorney, Agent, or Firm* — Wolf, Greenfield & Sacks, P.C.

(57) ABSTRACT

Micromechanical resonators having stub anchors are described. The micromechanical resonators may be suspended, being connected to a substrate or support by one or more anchors. The anchor(s) may include one or more stubs which can impact the acoustic impedance of the anchor(s). The stub(s) may have various shapes and sizes. In some instances, multiple resonators may be coupled together by a connector having one or more stubs.

20 Claims, 15 Drawing Sheets

(56) References Cited

U.S. PATENT DOCUMENTS

| | | |
|---|---|---|
| 6,954,020 B2 | 10/2005 | Ma et al. |
| 6,985,051 B2 | 1/2006 | Nguyen et al. |
| 6,995,622 B2 | 2/2006 | Partridge et al. |
| 7,005,946 B2 | 2/2006 | Duwel et al. |
| 7,211,926 B2 | 5/2007 | Quevy et al. |
| 7,215,061 B2 | 5/2007 | Kihara et al. |
| 7,352,608 B2 | 4/2008 | Mohanty et al. |
| 7,492,241 B2 | 2/2009 | Piazza et al. |
| 7,504,909 B2 | 3/2009 | Tada |
| 7,667,369 B2 | 2/2010 | Haskell et al. |
| 7,724,103 B2 | 5/2010 | Feng et al. |
| 7,791,432 B2 | 9/2010 | Piazza et al. |
| 7,886,575 B2 | 2/2011 | Haskell et al. |
| 8,174,170 B1 | 5/2012 | Kuypers et al. |
| 8,446,078 B2 * | 5/2013 | Bahreyni et al. ............ 310/368 |
| 2003/0117237 A1 | 6/2003 | Niu et al. |
| 2005/0073078 A1 | 4/2005 | Lutz et al. |
| 2007/0013464 A1 | 1/2007 | Pan et al. |
| 2007/0052498 A1 | 3/2007 | Pan et al. |
| 2008/0143217 A1 | 6/2008 | Ho et al. |
| 2008/0204153 A1 | 8/2008 | Yoshida et al. |
| 2008/0272852 A1 | 11/2008 | Six |
| 2009/0108381 A1 | 4/2009 | Buchwalter et al. |
| 2009/0108959 A1 | 4/2009 | Piazza et al. |
| 2009/0144963 A1 | 6/2009 | Piazza et al. |
| 2009/0243747 A1 | 10/2009 | Gaidarzhy et al. |
| 2009/0294638 A1 | 12/2009 | Mohanty et al. |
| 2010/0007443 A1 | 1/2010 | Mohanty et al. |
| 2010/0026136 A1 | 2/2010 | Gaidarzhy et al. |
| 2010/0134207 A1 | 6/2010 | Mohanty et al. |
| 2010/0155883 A1 | 6/2010 | Wenzler et al. |
| 2010/0181868 A1 | 7/2010 | Gaidarzhy et al. |
| 2010/0182102 A1 | 7/2010 | Kuypers et al. |
| 2010/0314969 A1 | 12/2010 | Gaidarzhy et al. |
| 2012/0280594 A1 | 11/2012 | Chen et al. |

FOREIGN PATENT DOCUMENTS

| | | |
|---|---|---|
| WO | WO 2006/000611 A1 | 1/2006 |
| WO | WO 2006/083482 A2 | 8/2006 |
| WO | WO 2006/124303 A1 | 11/2006 |
| WO | WO 2010/011288 A1 | 1/2010 |

OTHER PUBLICATIONS

Kaajakari et al., "Square-Extensional Mode Single-Crystal Silicon Micromechanical Resonator for Low-Phase-Noise Oscillator Applications," *IEEE Electron Device Letters* 25(4):173 (2004).

Khine et al., "7MHz length-extensional SOI resonators with T-shaped anchors," Solid-State Sensors, Actuators and Microsystems Conference: Transducers, Piscataway, NJ, US, Jun. 21, 2009.

Piazza et al., "Low motional resistance ring-shaped contour-mode aluminum nitride piezoelectric micromechanical resonators for UHF applications," Micro Electro Mechanical Systems, 2005. MEMS 2005. 18th IEEE International Conference on Miami Beach, Florida, Jan. 30-Feb. 3, 2005, Piscataway, New Jersey, US, IEEE Jan. 30, 2005, pp. 20-23.

Tirole et al., "Lamb Waves Pressure Sensor Using an A N/Si Structure," Proceedings Ultrasonics Symposium, Oct. 31, 1993-Nov. 3, 1993, Baltimore, MD, IEEE 1993 vol. 1, pp. 371-374.

* cited by examiner

US 9,299,910 B1

RESONATOR ANCHORS AND RELATED APPARATUS AND METHODS

RELATED APPLICATIONS

This Application claims the benefit under 35 U.S.C. §119 (e) of U.S. Provisional Application Ser. No. 61/648,238, filed on May 17, 2012 and entitled "MICROELECTROMECHANICAL SYSTEMS (MEMS) ANCHORS AND RELATED APPARATUS AND METHODS", which is hereby incorporated herein by reference in its entirety.

BACKGROUND

1. Field

The present application relates to resonator anchors and related apparatus and methods.

2. Related Art

Suspended resonators attached to a substrate by anchors are known.

BRIEF SUMMARY

According to an aspect of the present application, an apparatus is provided, comprising a support frame, and a rectangular mechanical resonating structure suspended above a cavity in the support frame. The suspended mechanical resonating structure has first and second sides of substantially equal length and first and second ends of substantially equal length, the first and second ends being shorter than the first and second sides. The apparatus further includes a first anchor mechanically connecting the mechanical resonating structure to the support frame and contacting the first side of the mechanical resonating structure, and a second anchor mechanically connecting the mechanical resonating structure to the support frame and contacting the second side of the mechanical resonating structure. Each of the first anchor and the second anchor may include a stub.

According to an aspect of the present application, an apparatus is provided, comprising a mechanical resonating structure, and an anchor coupling the mechanical resonating structure to a support, wherein the anchor comprises a stub.

According to an aspect of the present application, an anchored mechanical resonating structure is provided. The anchored mechanical resonating structure comprises a stubbed anchor. The stubbed anchor may include one or more stubs. In some embodiments, one or more stubs of the anchor may be multi-segment stubs.

BRIEF DESCRIPTION OF DRAWINGS

Various aspects and embodiments of the application will be described with reference to the following figures. It should be appreciated that the figures are not necessarily drawn to scale. Items appearing in multiple figures are indicated by the same reference number in all the figures in which they appear.

DETAILED DESCRIPTION

Figure 1A:
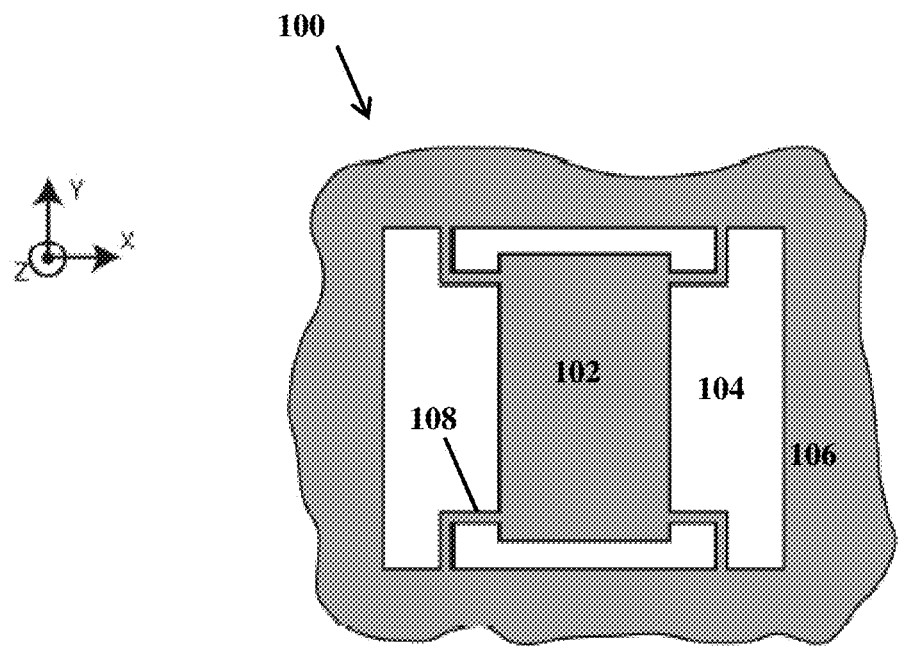
FIGS. 1A-1C illustrate three different anchor configurations for anchoring a mechanical resonating structure.

Some microelectromechanical systems (MEMS) devices, such as MEMS resonators, include a mechanical element, integrated transducers to force and/or sense the motion of the mechanical element, and electronic circuitry to amplify, filter, convert, and otherwise condition the signals of the integrated system. In many cases the mechanical element is a "proof mass," in the form of a plate or a disk, supported at its perimeter and/or interior by one or more anchors. For devices of this type with low resonance frequency, commonly less than 10 MHz, the anchors generally determine the stiffness of the mechanical system. As frequencies exceed roughly 10 MHz, the stiffness and resonance frequency of the mechanical system are typically determined by the acoustic vibrational mode of the mechanical element, which again may be a plate as a non-limiting example. For such frequencies, the anchors ideally do not affect the stiffness of the mechanical mode. However, the anchors may serve other purposes including: (1) attaching the plate or other resonant body (or "resonating structure") to a support, such as a substrate (e.g., a silicon substrate); (2) providing electrical access to and from the plate or other resonant body, for example by supporting wiring lines; (3) decoupling package-induced stress that the substrate experiences from the plate; (4) controlling the quality factor, Q, which in some configurations of interest may be inversely proportional to the energy that leaks out of the plate (or other resonant body) through the anchors; and (5) suppressing undesired mechanical modes.

The geometry of an anchor may be selected at least partially in dependence on the five functions identified above. The attachment (function #1) and electrical access functions (function #2) may be accomplished by a variety of anchor geometries. Stress decoupling (function #3) may be accomplished using a flexure design. Flexures allow the implementation of springs with predetermined compliance in multiple dimensions by control of lateral dimensions, flexure shape, and a single thickness. Q control (function #4) and mode suppression (function #5) are applications specific to radio frequency (RF)/high frequency applications.

In at least some embodiments, then, anchors may have dual functions: 1) as static mechanical elements that deform in response to an applied mechanical stimuli; and 2) as waveguides that control the amount of acoustic energy trapped in the mechanical element (e.g., the plate). Anchors and related structures according to one or more aspects of the present application satisfy both functions. For example, anchors according to one more aspects may deflect in response to stress so that the plate does not deform, while at the frequencies of interest controlling the energy trapped in the resonator.

According to an aspect of the application, an anchor for a mechanical resonating structure comprises one or more stubs (also referred to herein in some embodiments as "extensions", "acoustic tuners," and "impedance tuning elements"). The stubs may be designed to provide desired acoustic waveguide characteristics of the anchor(s), such as providing a desired acoustic impedance. The stubs may be positioned at any suitable location of the anchor(s) (e.g., at an end of the anchor closest to the anchored mechanical resonating structure (e.g., a plate), at an end distal the mechanical resonating structure, at a midpoint of the anchor, or at any other suitable location), and may take any suitable form, including having one or more segments, open geometries, closed geometries (e.g., squares, rectangles, etc.), or any other suitable geometry. In at least some embodiments, a stub may represent a portion of the anchor which is not part of a continuous path between the mechanical resonating structure (e.g., a plate) and the substrate. In at least some embodiments, a stub may represent a portion of the anchor that is not part of the shortest continuous path between the mechanical resonating structure and the substrate.

According to another aspect of the present application, a method for fabricating an anchored mechanical resonating structure comprises fabricating an anchor comprising one or more stubs. The anchor may be formed lithographically or in any other suitable manner.

The aspects and embodiments described above, as well as additional aspects and embodiments, are described further below. These aspects and/or embodiments may be used individually, all together, or in any combination of two or more, as the application is not limited in this respect.

Figure 2A:
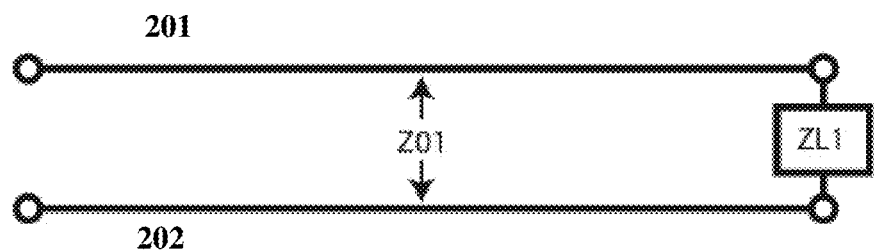
FIGS. 2A-2C illustrate lumped element impedance diagrams of three different microwave waveguide configurations.
Figure 2B:
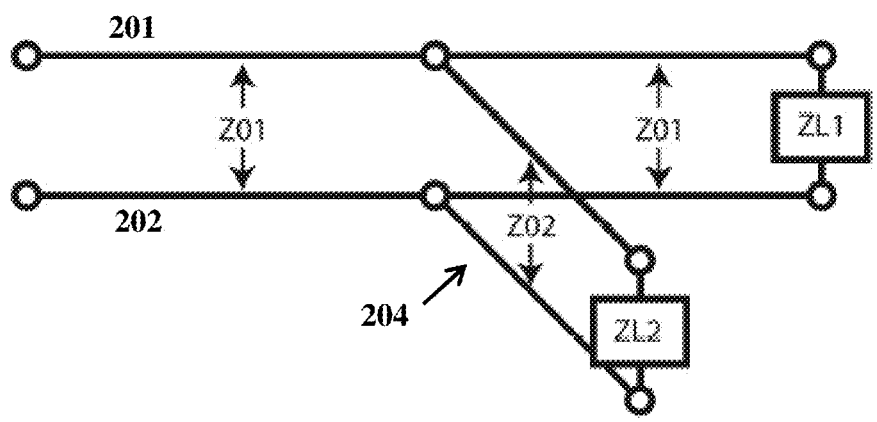
Figure 2C:
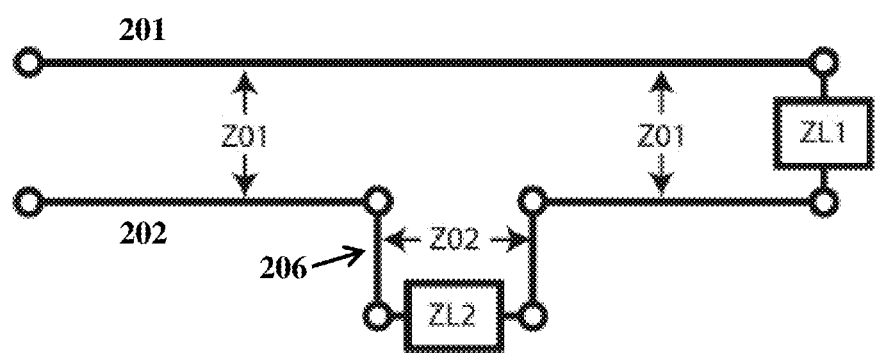

The following figures, except for FIGS. 2A-2C, illustrate top-down views of devices. The illustrated devices may be made from suitable materials, a non-limiting example of which is silicon. In some embodiments, the illustrated devices may have a multi-layer structure (e.g., being made up in cross-section of multiple layers of different materials stacked on each other, a configuration which may be referred to herein as a multilayer stack). For example, according to one embodiment the illustrated devices may be formed of a stack of materials including Si, $SiO_2$, Mo, and AlN thin films, sometimes in that order from bottom to top. However, the various aspects of the present application are not limited in this respect, and one or more aspects may apply to any material system for any plate/anchor structure with a nominally uniform shape in the thickness direction (z-direction). In some embodiments, a multi-layer stack of a mechanical resonating structure may include one or more of Si, $SiO_2$, Mo, AlN, Al, PZT, quartz, or $LiNbO_3$.

FIG. 1A shows a device 100 including a resonant body 102 (also referred to herein as a "resonating structure", and illustrated in FIG. 1A as a rectangular plate) suspended above a cavity 104 and attached to a reference frame 106 (also referred to herein as a support), such as a silicon die, with four "crab-leg" flexures 108. The crab-leg flexures 108 provide compliance in the x-, y-, and z-directions and enable decoupling of stress between the resonant body 102 and the frame 106.

Figure 1B:
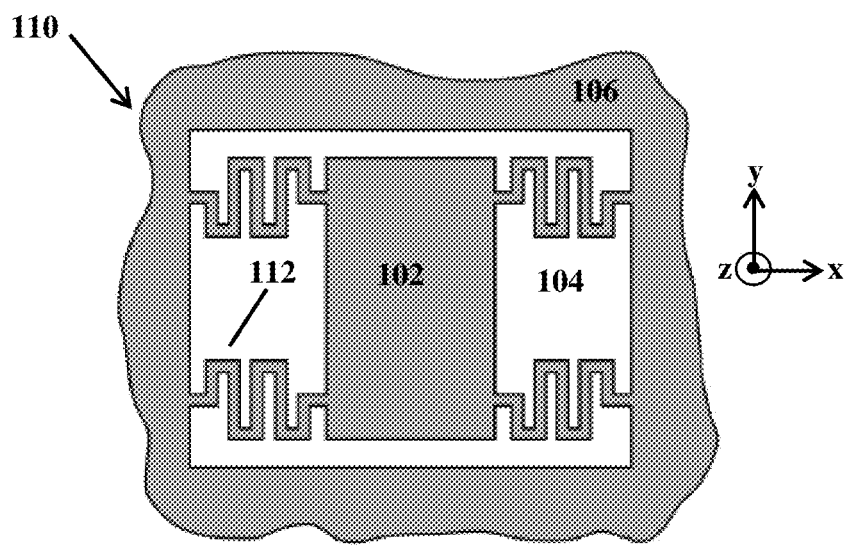

FIG. 1B shows a device 110 in which the resonant body 102 is attached to the reference frame 106 with four "serpentine" flexures 112. Compared with the crab-leg flexures 108 of FIG. 1A, the serpentine flexures 112 can be used to achieve higher (and in some cases, much higher) compliances without consuming excessive area on the die.

Figure 1C:
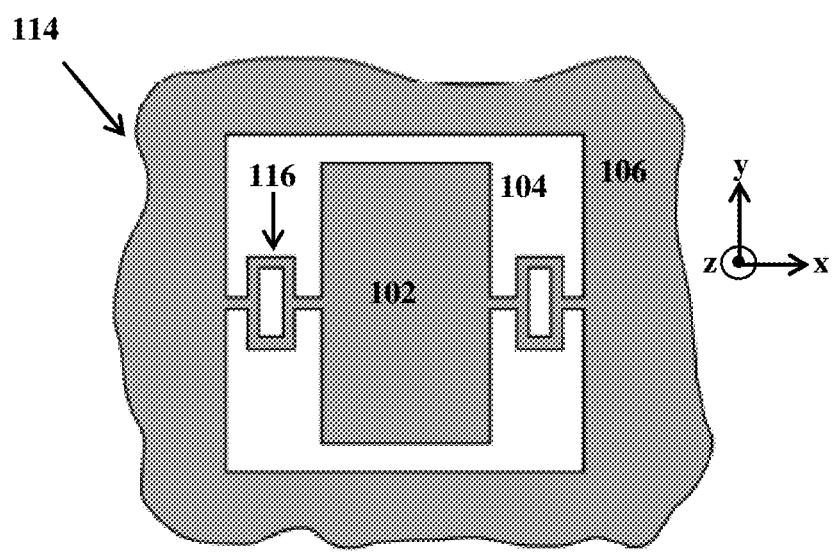

FIG. 1C shows a device 114 in which the resonant body 102 is attached to the reference frame 106 with two "box" flexures 116, which maximize compliance in the x-direction and which may, in some embodiments, minimize compliance in the y-direction. The box flexures may also be considered T-anchors since one side of the box may be considered to form a T with a perpendicular segment of the anchor.

In all the figures illustrated herein, the resonant body 102 may operate by vibrating. Various vibrational modes may be induced. In some embodiments, Lamb waves may be excited in and supported by the resonant body 102. In some embodiments, plate flexural modes may be excited and supported. In some embodiments, the resonant body 102 may vibrate in-plane (i.e., in the x-y plane), with minimal or no out-of-plane vibration (i.e., minimal or no vibration in the z-direction). In some embodiments, the resonant body 102 may exhibit primary vibration in the y-direction (e.g., parallel to the length of the resonant body) and secondary, smaller vibration in the x-direction. For example, the primary vibration may be five times larger than any vibration in the secondary direction, ten times larger, between three and fifteen times larger, any value or range of values within such ranges, or any other suitable magnitude.

The anchors connecting a mechanical resonating structure (e.g., resonant body 102) to a support frame may operate as waveguides. Stubs may be added to the anchors to control the waveguide operation, and thus influence the operation of the mechanical resonating structure. Such operation can be understood by considering the lumped element representation of such a configuration.

FIGS. 2A-2C illustrate lumped element representations of microwave waveguides, such as coaxial cable assemblies, describing the electrical impedances of such a system. It should be appreciated that the acoustic impedances at issue in the present application may be represented similarly and that the electrical representations are provided for purposes of illustration. In the case of FIGS. 2A-2C, the waveguide is represented by parallel lines 201 and 202 representing the core and shield of a cable with a characteristic impedance Z01 attached to a load of impedance ZL1. Junctions representing connection points are drawn as circles.

In FIG. 2A, a single cable is shown attached to the load. In the acoustic domain, the configuration of FIG. 2A would correspond to a single straight anchor.

In FIG. 2B, a "shunt stub" 204 is added as a parallel segment of the cable with characteristic impedance Z02 and load ZL2.

FIG. 2C illustrates a "series stub" configuration including a series stub 206.

The stubs in FIGS. 2B and 2C appear superfluous, but due to the wave nature of the propagating microwave signal, the stubs affect (and in some cases, strongly affect) the input impedance of the transmission line (the cable in the electrical setting and the anchor in the acoustic setting) and thus its ability to reflect energy. The location of the stub, its length, the load it is attached to (if any), and its characteristic impedance all affect the impedance. The result of such a design is that if it is attached to an acoustic microwave resonator, the quality factor (Q) of the resonator can be adjusted by these parameters.

Figure 3A:
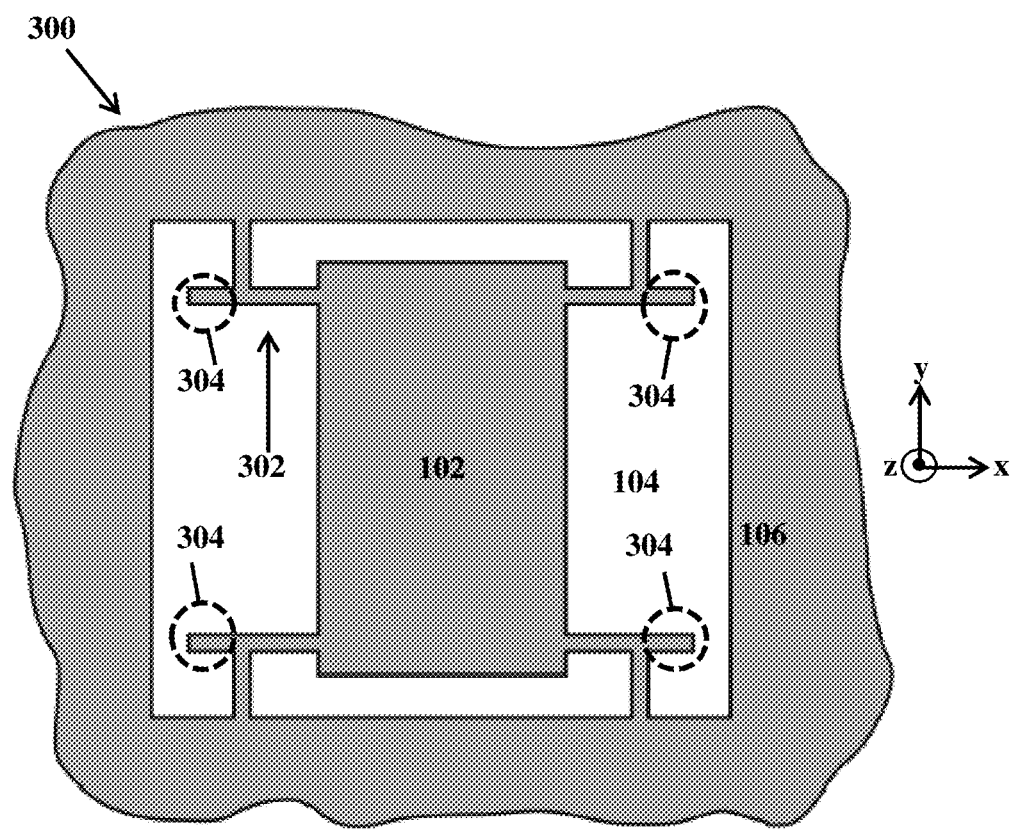
FIGS. 3A-3B illustrate alternative configurations for stubbed crab-leg anchors for anchoring a mechanical resonating structure.
Figure 3B:
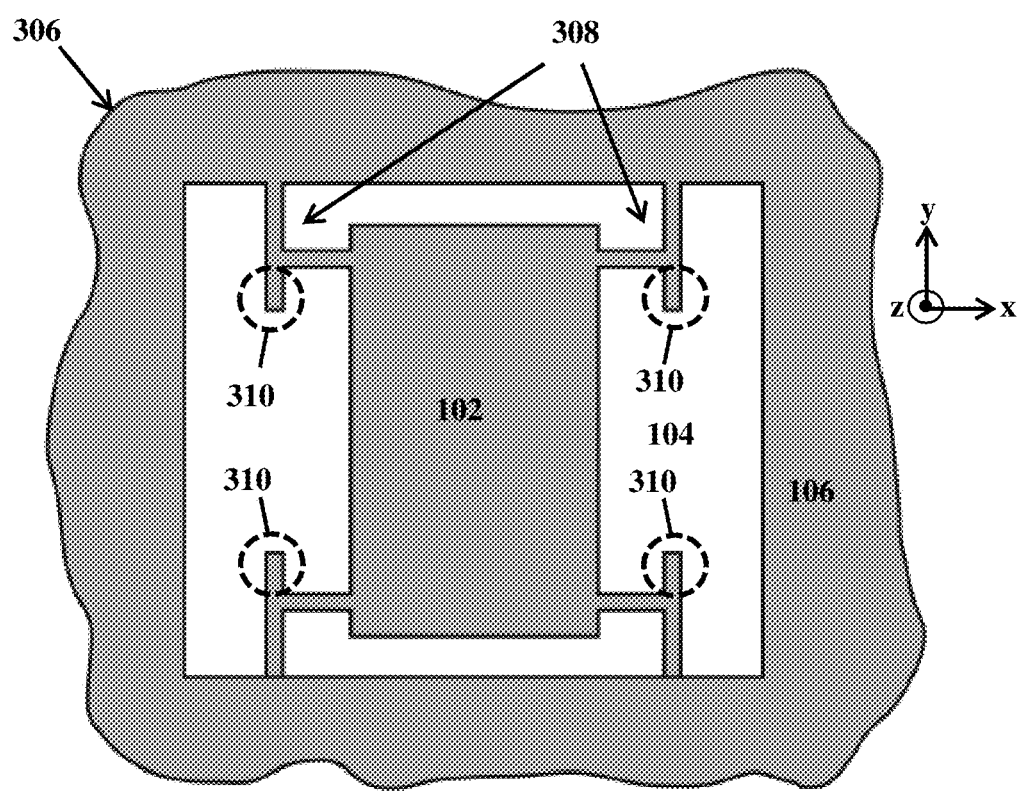

FIGS. 3A-3B illustrate variations on the anchor structure of FIG. 1A in which the crab-leg flexure includes a stub. In the figures, the stub is a segment of material added to the crab flexure. FIG. 3A shows a device 300 in which each of the four illustrated anchors 302 includes a stub 304 on the crab-leg configuration. The stubs 304 are identified by the dashed circles. In this embodiment, the stubs 304 may be said to be in the "primary" orientation of the flexure, where the stub 304 is aligned with the segment of the crab leg that attaches to the resonant body 102. This configuration may give the strongest reflectivity in some embodiments.

FIG. 3B shows a device 306 in which each of the four illustrated anchors 308 includes a stub 310, identified by the dashed circles. In this embodiment, the stubs 310 may be said to be in the "secondary" orientation, where the stubs 310 are aligned with the segment of the crab leg attached to the support frame 106. This configuration may have a weaker effect on reflectivity than that of FIG. 3A.

The "stubbed crab-leg" flexures (or, more generally, stubbed anchors) of FIGS. 3A-3B are shown for the non-limiting case where the stub(s) has the same width and thickness as the other segments in the crab-leg anchor, and the angles of the flexure are all 90°. The various aspects described herein are not limited in these respects. For example, the stub may differ in width and/or thickness from one or more other segments of an anchor. For example, a stub may be thicker than other segments of an anchor or in some embodiments may be thinner than other segments of an anchor. Furthermore, the stub need not be at any particular angle with respect to the other segments of the anchor. Moreover, the stub may have any suitable length relative to the other segments of the anchor. For example, a stub may be between approximately one-quarter and three-quarters as long as the longest segment of the anchor, between approximately one-third and two-thirds as long as the longest segment of the anchor, any range or value within such ranges, or any other suitable length. In the illustrated implementations of FIGS. 3A-3B, the stub negligibly affects the compliances of the flexure due to its location, but changing its length will modulate the acoustic impedance of the flexure, and thus the Q of the acoustic resonator.

Figure 4A:
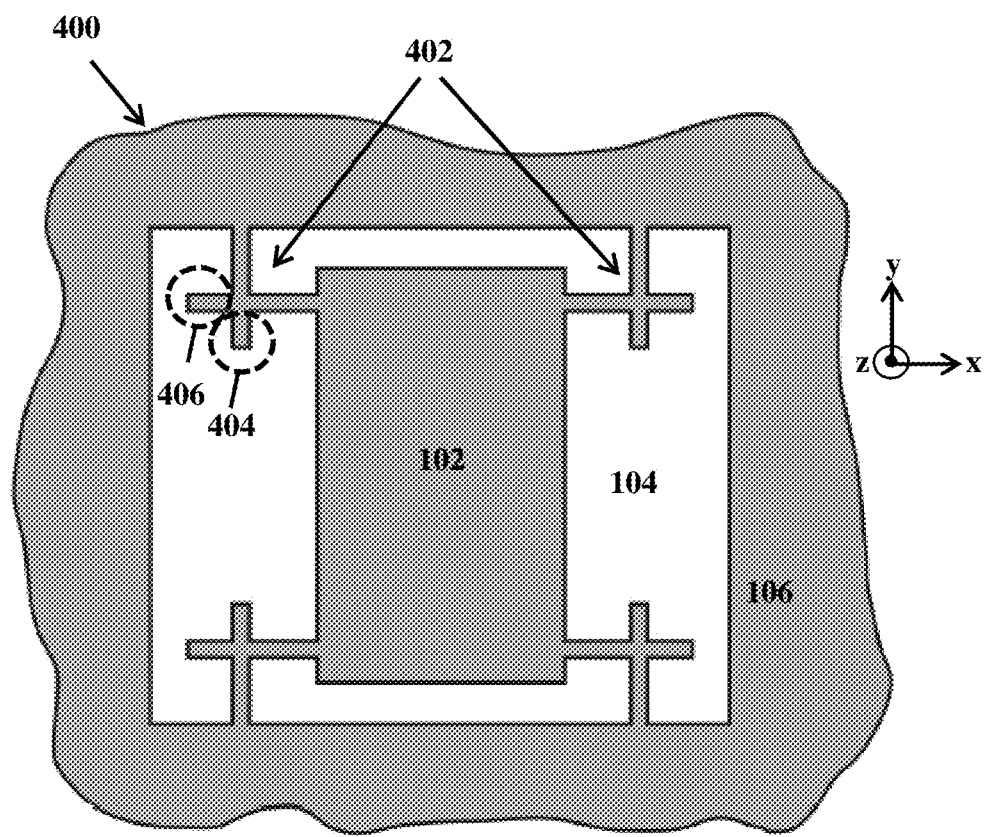
FIGS. 4A-4B illustrate alternative configurations for stubbed crab-leg anchors for anchoring a mechanical resonating structure in which the anchor includes two stubs.

The primary and secondary orientations of the stub can be combined as shown in FIG. 4A, in what may be termed a "multi-stub" configuration. Such multi-stub configurations can achieve a wider range of reflectivities and can enable designs that are insensitive to process variations such as overetch. FIG. 4A illustrates a device 400 combining the stub configurations of FIGS. 3A and 3B. Namely, the device 400 includes four anchors 402, each of which includes two stubs, 404 and 406. Thus, each anchor includes a stub in the above-described primary orientation as well as a stub in the above-described secondary orientation. Thus, FIG. 4A illustrates a 2-stub "cross" configuration of the stubbed crab-leg flexure.

Figure 4B:
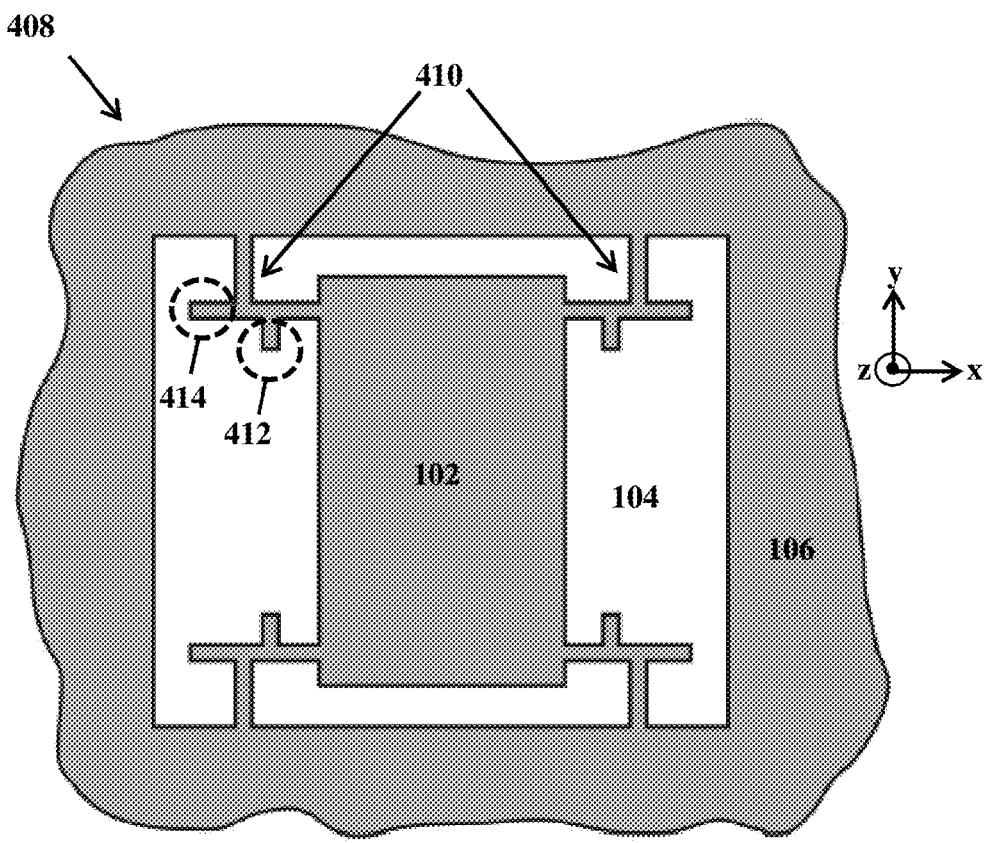

FIG. 4B illustrates an alternative 2-stub implementation. The device 408 includes four anchors 410, each of which includes two stubs, 412 and 414, identified by the dashed circles. One of the stubs of each anchor, namely stub 412, is not located at the corner of the corresponding crab-leg anchor 410, and thus the compliance of the anchor is likely to be affected by this stub.

Figure 5A:
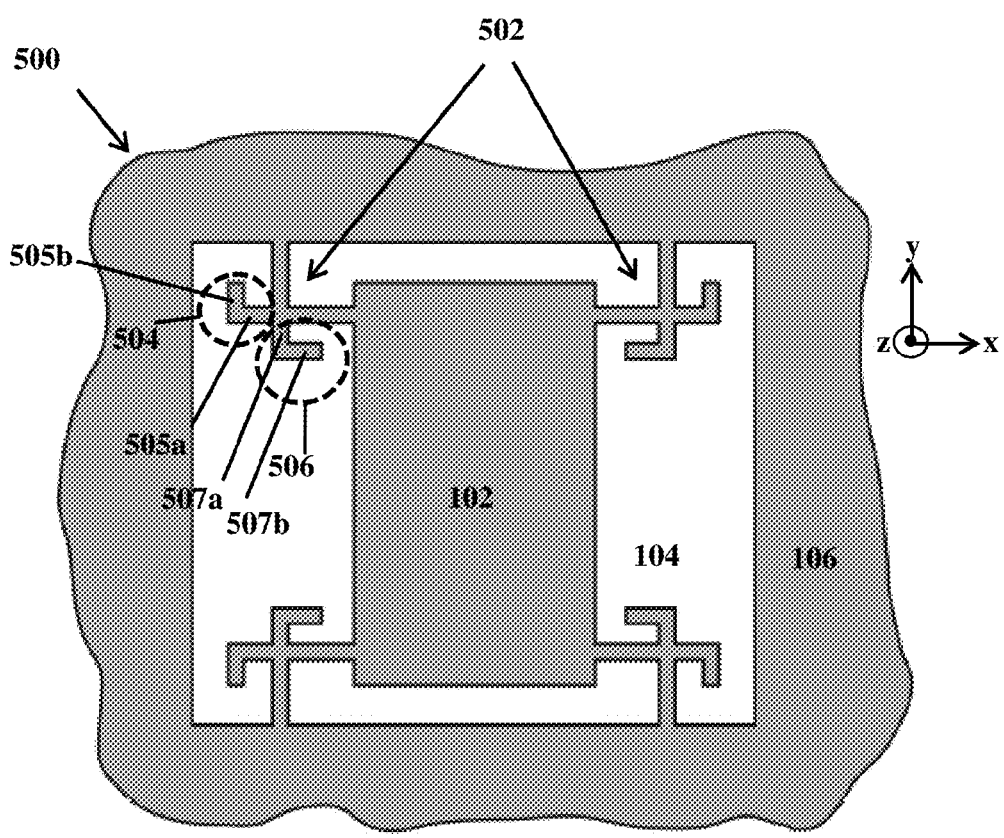
FIGS. 5A-5B illustrate examples of multi-segment stubs which may be used with anchors for anchoring a mechanical resonating structure.
Figure 5B:
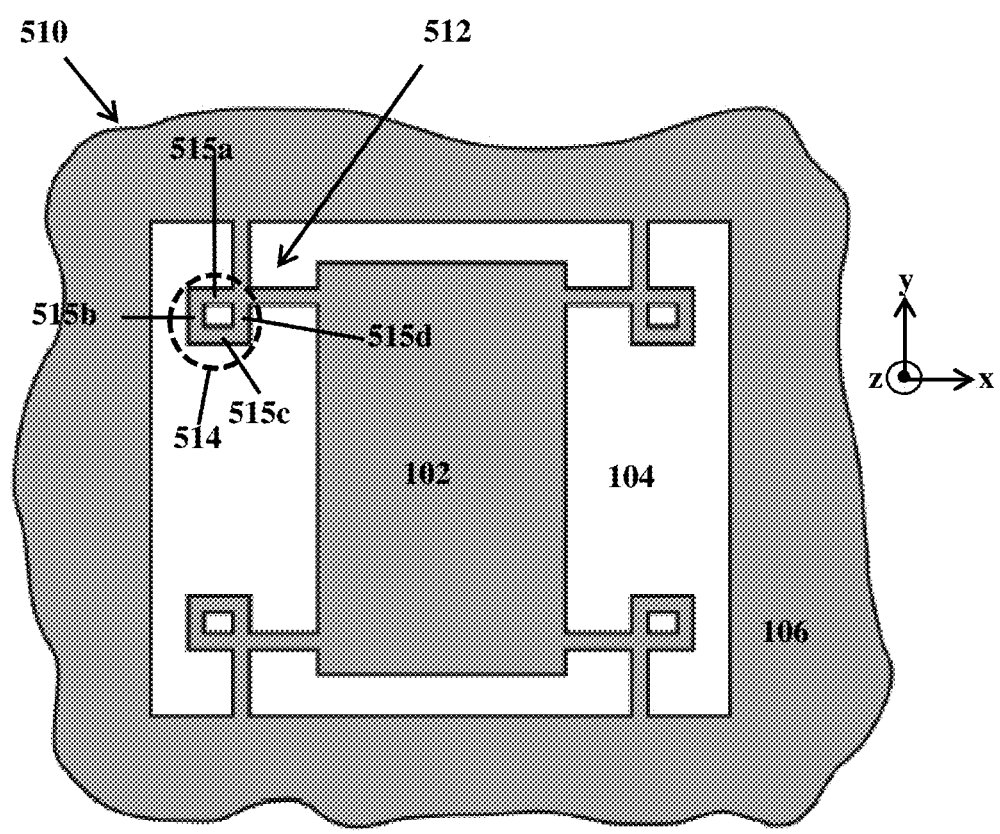

FIGS. 5A-5B illustrate devices including multi-segment anchor stubs. FIG. 5A illustrates a device 500 in which each of the four illustrated anchors 502 includes two multi-segment stubs. For example, as shown, a single anchor 502 may include a first stub 504 and a second stub 506. The first stub 504 may include two segments 505a and 505b. The second stub 506 may include two segments 507a and 507b. These multi-segment stubs 504 and 506 are mechanically isolated at their ends (i.e., the segments of the stub do not form a closed contour).

FIG. 5B illustrates an alternative configuration to that of FIG. 5A in which the multi-segment stubs of an anchor form a closed contour. As shown, the device 510 includes four anchors 512, each of which includes a stub 514 having four segments 515a-515d. The stub 514 forms a closed contour, i.e., the segments 515a-515d are shorted together. It should be appreciated that a stub forming a closed contour may have any suitable number of segments, as four segments represents a non-limiting example. For example, a stub having a closed contour may have three segments (i.e., a triangle), six segments, eight segments, a single segment (e.g., a circle), or any other suitable number of segments.

Figure 6A:
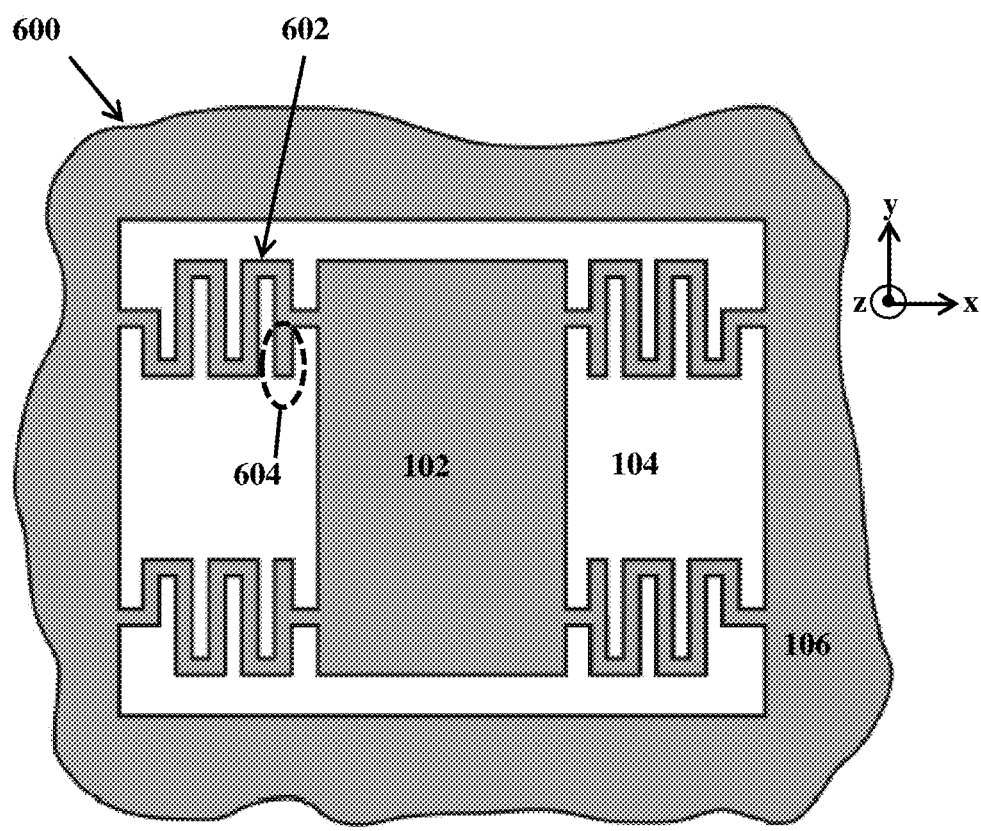
FIGS. 6A-6B illustrate alternative configurations for serpentine stub anchors for anchoring a mechanical resonating structure.
Figure 6B:
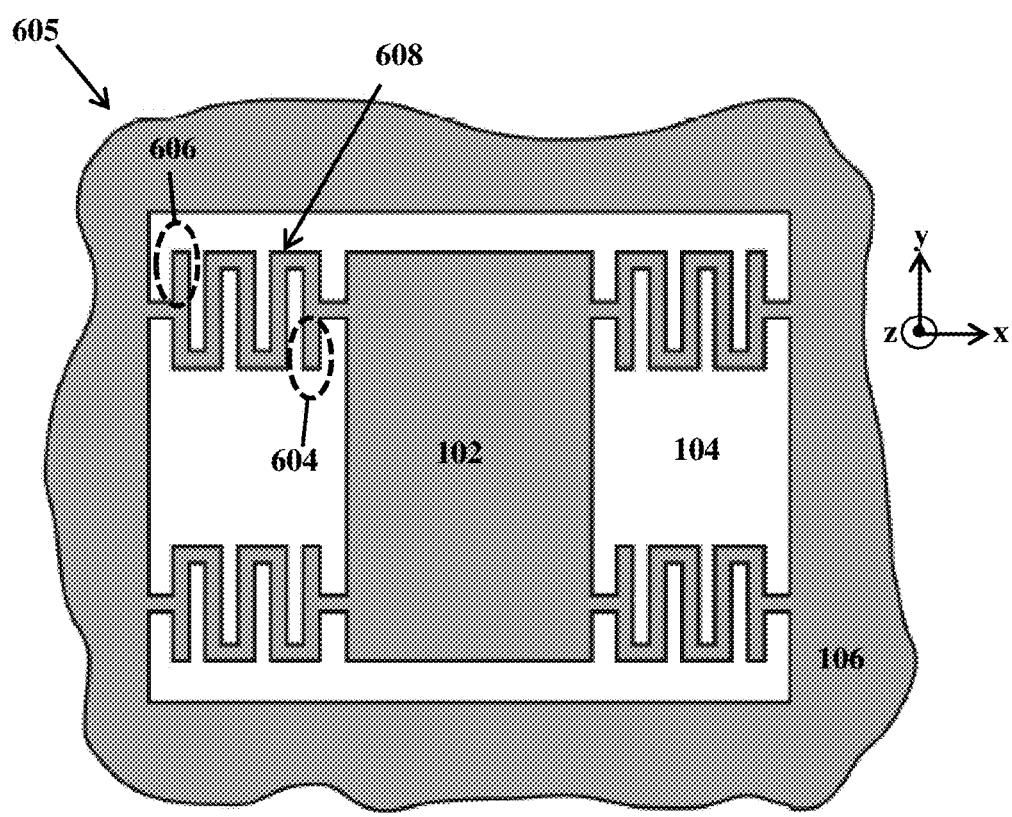

FIGS. 6A-6B show non-limiting implementations of single- and multi-stub serpentine flexures. FIG. 6A illustrates a device 600 including four anchors 602, each of which includes a stub 604. As shown, the anchors 602 have a serpentine configuration. The stub is placed proximate the resonant body 102, though other locations are possible.

For example, FIG. 6B illustrates an alternative device 605 to that of FIG. 6A in which the serpentine anchor 608 includes a stub 606 distal the resonant body 102 in addition to the stub 604 proximate the resonant body 102. Thus, each of the anchors 608 includes two stubs. Other configurations are possible. For example, a serpentine anchor may have one or more stubs at locations other than those shown in FIGS. 6A-6B, and/or the anchor may have three or more stubs. Thus, FIGS. 6A-6B represent non-limiting examples.

Figure 7A:
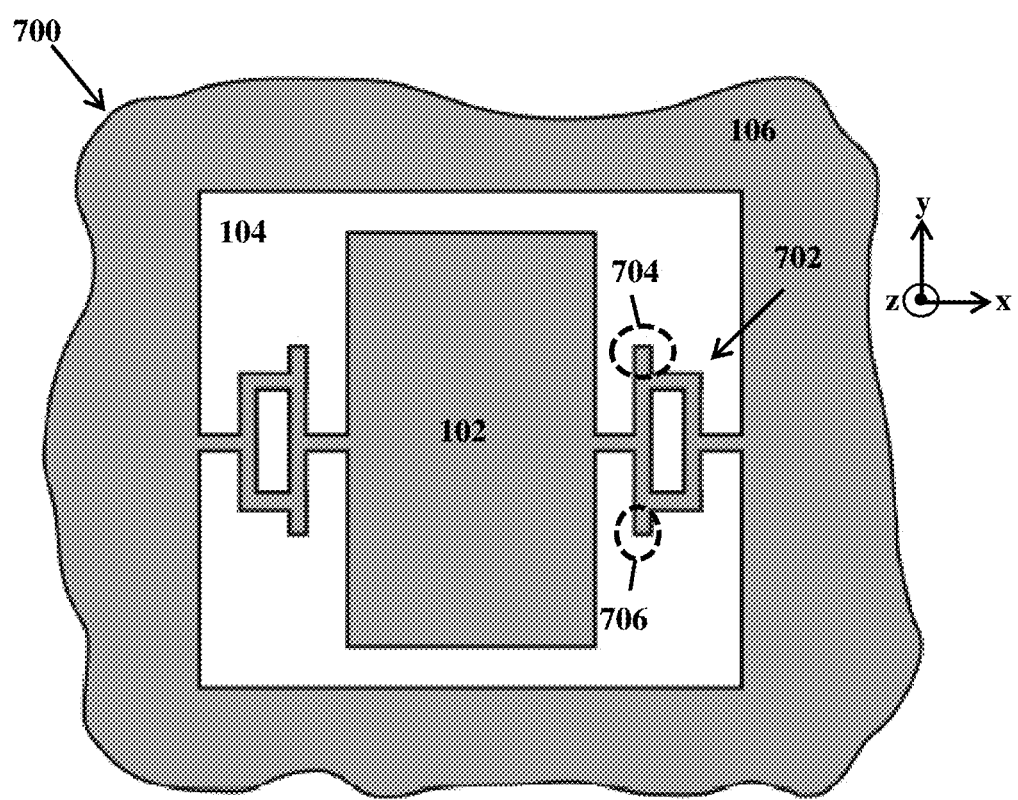
FIGS. 7A-7B illustrate alternative configurations for box-type stub anchors for anchoring a mechanical resonating structure.
Figure 7B:
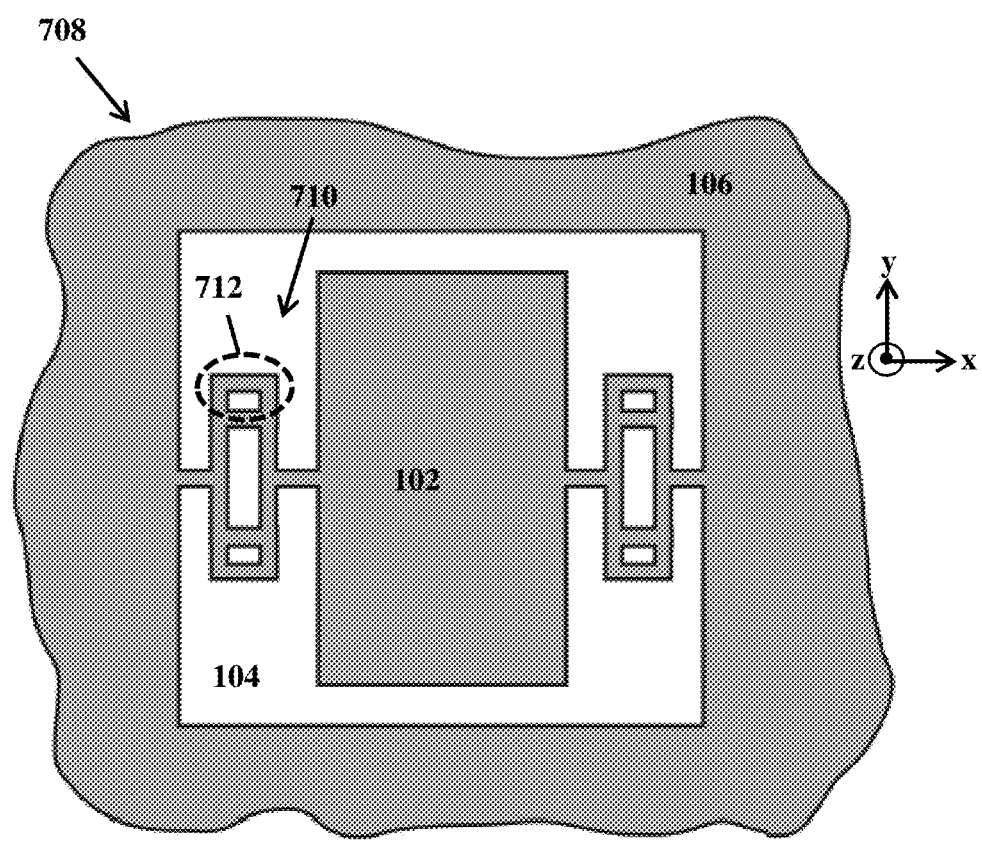

FIGS. 7A-7B show non-limiting implementations of multi-stub box anchors. In FIG. 7A, the device 700 includes two anchors 702, each of which is of a box-type configuration. Each anchor 702 includes two stubs 704 and 706.

In FIG. 7B, the device 708 includes two box-type anchors 710 each having multi-segment stubs 712 which form a closed contour.

Figure 8:
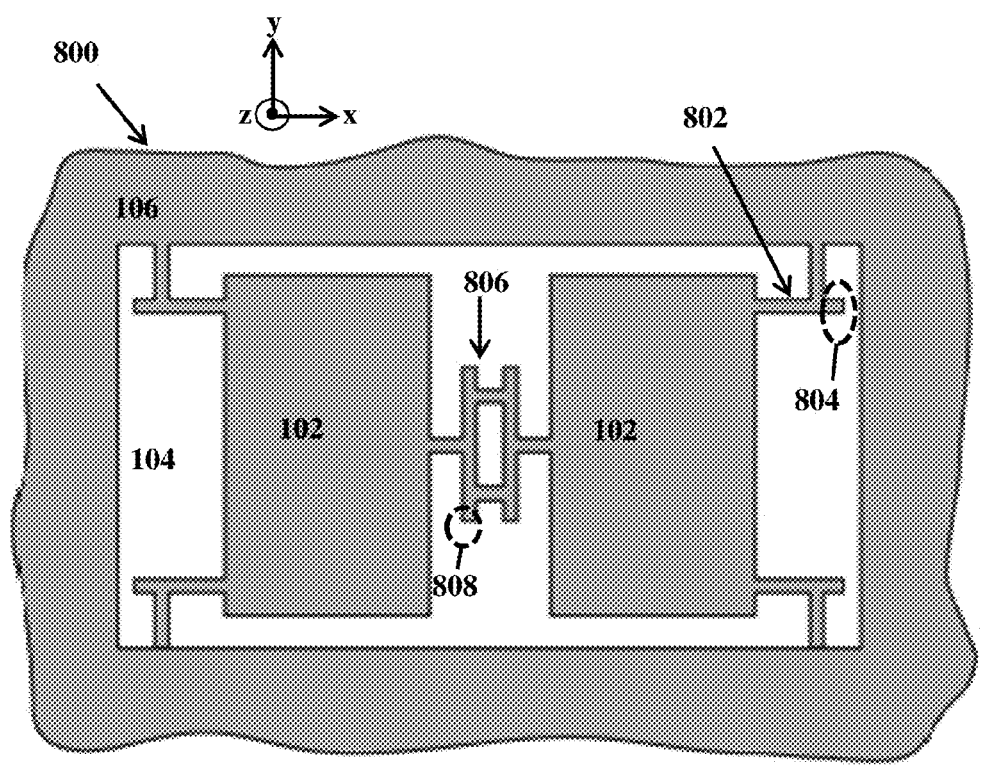
FIG. 8 illustrates an example of a device including two coupled mechanical resonating structures in which the anchors and the coupler include one or more stubs.

In addition to Q control of resonators, stubs can be used to control coupling of multi-resonator structures such as filters, resonant accelerometers, and gyroscopes. A 2-resonator structure is illustrated in FIG. 8 as device 800. The device 800 includes two resonant bodies 102 of the type previously described. Each resonant body 102 is coupled to the support frame 106 by two anchors 802, which are illustrated as crab-leg anchors. Each of the anchors 802 includes a stub 804. Moreover, the two resonant bodies 102 are coupled to each other by a coupler 806 adopting a box-type anchor configuration. The coupler 806 includes four stubs 808. Thus, the coupling of the resonant bodies is controlled by a stubbed box flexure while acoustic losses are controlled by stubbed crab-leg structures. The choice of flexure/anchor design parameters may depend on the application and the nature of the resonant modes of interest, as non-limiting examples.

It should be appreciated from the foregoing non-limiting examples that in at least some embodiments, a stub of an anchor may represent a portion of the anchor which is not part of a continuous path between the mechanical resonating structure (e.g., a plate) and the substrate. For example, in FIGS. 3A-3B, 4A-4B, 5A, 6A-6B, and 7A the illustrated stubs on the anchors are not part of a continuous path from the resonant body 102 to the support frame 106. In at least some embodiments, a stub may represent a portion of the anchor that is not part of the shortest continuous path between the mechanical resonating structure and the substrate. For example, in FIGS. 5B and 7B the stubs may be considered to be part of a continuous path from the resonant body 102 to the support frame 106 since they form closed contours, but they are not part of the shortest continuous path. Rather, they represent extensions of the path from the resonant body 102 to the support frame 106.

Although not explicitly shown, it should be appreciated that any of the mechanical resonating structures illustrated and described herein may include suitable structures for actuating and/or detecting operation (e.g., vibration) of the mechanical resonating structure. For example, resonant body 102 may have one or more electrodes on a top and/or bottom surface thereof. In some embodiments, two or more interdigitated transducers (IDT) formed by suitable electrodes may be included.

It should be appreciated that various alterations and modifications to the examples described above are possible. For example, while some of the embodiments have been described as including resonators (e.g., piezoelectric resonators), it should be appreciated that such structures are not limiting. Some of the techniques described herein may be used to form piezoelectric filters, piezoelectric sensors, or other devices, and resonators should be understood to be merely one non-limiting example. Also, the devices need not be piezoelectric.

The mechanical resonating structures may have any desired resonance frequencies and frequencies of operation, and may be configured to provide output signals of any desired frequencies. For example, the resonance frequencies and/or frequencies of operation of the mechanical resonating structures, and the frequencies of the output signals provided by the mechanical resonating structure, may be between 1 kHz and 10 GHz. In some embodiments, they may be in the upper MHz range (e.g., greater than 100 MHz), or at least 1 GHz (e.g., between 1 GHz and 10 GHz). In some embodiments, they may be at least 1 MHz (e.g., 13 MHz, 26 MHz) or, in some cases, at least 32 kHz. In some embodiments, they may be in the range of 30 to 35 kHz, 60 to 70 kHz, 10 MHz to 1 GHz, 1 GHz to 3 GHz, 3 GHz to 10 GHz, or any other suitable frequencies. Thus, it should be appreciated that the frequencies are not limiting.

The mechanical resonating structures described herein may have any suitable dimensions, and in some embodiments may be micromechanical resonating structures. A mechanical resonating structure may have any suitable thickness, T, and in some embodiments the thickness may be related to a wavelength of a desired oscillation mode. According to a non-limiting embodiment, the thickness T may be less than $2\lambda$, less than $\lambda$, less than $\frac{1}{2}\lambda$, less than $\frac{1}{4}\lambda$, less than $\frac{1}{6}\lambda$, or any other suitable value, where $\lambda$ is a wavelength of operation of the mechanical resonating structure (e.g., a wavelength of a resonance mode of interest of a mechanical resonating structure, an acoustic wavelength of a Lamb wave of interest, etc.). According to a non-limiting embodiment, the mechanical resonating structure may be configured to support Lamb waves, and T may be less than $2\lambda$, less than $\frac{1}{2}\lambda$, or have any other suitable According to some embodiments, the mechanical resonating structures described herein have a large dimension (e.g., the largest of length, width, diameter, circumference, etc. of the mechanical resonating structure) of less than approximately 1000 microns, less than approximately 500 microns, less than approximately 100 microns, less than approximately 50 microns, or any other suitable value. As a specific example, the resonator may have at least one critical dimension (impacting the resonance frequency of the resonator) of size 500 microns or less. It should be appreciated, however, that other sizes are also possible. According to some embodiments, the devices described herein form part or all of a microelectromechanical system (MEMS).

Mechanical resonating structures according to one or more aspects of the present application may comprise any suitable materials. The structure may, in some situations, preferably comprise quartz, but may alternatively comprise $LiNbO_3$, $LiTaO_3$, aluminum nitride (AlN), or any other suitable piezoelectric material (e.g., zinc oxide (ZnO), cadmium sulfide (CdS), lead titanate ($PbTiO_3$), lead zirconate titanate (PZT), potassium niobate ($KNbO_3$), $Li_2B_4O_7$, langasite ($La_3Ga_5SiO_{14}$), gallium arsenide (GaAs), barium sodium niobate, bismuth germanium oxide, indium arsenide, indium antimonide), either in substantially pure form or in combination with one or more other materials. Moreover, in some embodiments the structure may comprise single crystal piezoelectric material (e.g., single crystal quartz), although not all embodiments are limited in this respect.

Having thus described several aspects of at least one embodiment of the technology, it is to be appreciated that various alterations, modifications, and improvements will readily occur to those skilled in the art. Such alterations, modifications, and improvements are intended to be within the spirit and scope of the technology. Accordingly, the foregoing description and drawings provide non-limiting examples only.

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Elements other than those specifically identified by the "and/or" clause may optionally be present, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:
1. An apparatus, comprising:
a support frame;
a rectangular mechanical resonating structure suspended above a cavity in the support frame, the suspended mechanical resonating structure having first and second sides;

a first anchor mechanically connecting the mechanical resonating structure to the support frame and contacting the first side of the mechanical resonating structure; and a second anchor mechanically connecting the mechanical resonating structure to the support frame and contacting the second side of the mechanical resonating structure, wherein each of the first anchor and the second anchor includes a stub representing an extension having a free end or a closed contour off-center from a segment of the anchor from which it extends.

2. The apparatus of claim 1, wherein the stub of the first anchor comprises multiple segments.

3. The apparatus of claim 1, wherein the stub of the first anchor forms a closed contour.

4. An apparatus, comprising:
a support frame;
a mechanical resonating structure; and
an anchor coupling the mechanical resonating structure to the support frame, wherein the anchor comprises a stub representing an extension having a free end or a closed contour off-center from a segment of the anchor from which it extends.

5. The apparatus of claim 4, wherein the anchor comprises multiple stubs.

6. The apparatus of claim 4, wherein the stub comprises multiple segments.

7. The apparatus of claim 6, wherein the multiple segments of the stub form a substantially closed contour.

8. The apparatus of claim 6, wherein the multiple segments of the stub do not define a closed contour.

9. The apparatus of claim 6, wherein the multiple segments of the stub form a cross.

10. The apparatus of claim 4, comprising multiple anchors each including a stub.

11. The apparatus of claim 4, wherein the support is a substrate.

12. The apparatus of claim 4, wherein the mechanical resonating structure is a piezoelectric resonating structure.

13. The apparatus of claim 4, wherein the mechanical resonating structure is a suspended mechanical resonating structure.

14. The apparatus of claim 4, wherein the stub represents an extension having a free end.

15. The apparatus of claim 4, wherein the anchor comprises a crab flexure.

16. The apparatus of claim 4, wherein the anchor comprises a serpentine flexure.

17. The apparatus of claim 4, wherein the anchor comprises a box flexure.

18. The apparatus of claim 4, wherein the anchor is coupled to a side of the mechanical resonating structure.

19. The apparatus of claim 18, wherein the side of the mechanical resonating structure is substantially parallel to a direction of vibration of a primary resonance mode of the mechanical resonating structure.

20. The apparatus of claim 4, wherein the mechanical resonating structure is a first mechanical resonating structure, and wherein the apparatus further comprises a second mechanical resonating structure coupled to the first mechanical resonating structure by a flexure, and wherein the flexure comprises a stub.

* * * * *